US005479097A

United States Patent [19]
Cheatham et al.

[11] Patent Number: 5,479,097
[45] Date of Patent: Dec. 26, 1995

[54] DATA CORRUPTION DETECTOR FOR MAGNETIC MEDIA

[75] Inventors: Samuel D. Cheatham, Golden; Jerry L. Donze, Arvada; James M. Frary, Louisville, all of Colo.

[73] Assignee: Storage Technology Corporation, Louisville, Colo.

[21] Appl. No.: 175,049

[22] Filed: Dec. 29, 1993

[51] Int. Cl.⁶ .......................... G01R 33/12; G11B 23/02
[52] U.S. Cl. .......................... 324/210; 360/132; 324/260
[58] Field of Search .................................... 324/210, 212, 324/214, 215, 216, 200, 213, 260, 244; 365/108, 112, 113, 121, 122, 171; 371/21.1, 21.4; 369/291; 360/132, 135, 133, 137, 138

[56] References Cited

U.S. PATENT DOCUMENTS

| | | | |
|---|---|---|---|
| 4,414,650 | 11/1983 | Ohta et al. | 365/121 |
| 4,707,756 | 11/1987 | Futamoto et al. | 360/134 |
| 5,239,504 | 8/1993 | Brady et al. | 365/122 |
| 5,307,228 | 4/1994 | Grasty | 360/132 |

Primary Examiner—Sandra L. O'Shea
Assistant Examiner—Roger Phillips
Attorney, Agent, or Firm—Sterne, Kessler, Goldstein & Fox

[57] ABSTRACT

A tape cartridge or other physical volume includes a housing configured to accommodate magnetic data storage media, such as a reel of magnetic tape. A magnetic field detector is coupled to the housing for indicating whether the housing has been exposed to a magnetic field of sufficient intensity to corrupt or bulk erase the magnetic media. In a first embodiment, the detector is implemented as a magnetic media element having a predefined pattern of magnetic domains recorded thereon. In a second embodiment, the detector is implemented with a magnetic film element having a predefined pattern of magnetic domains recorded thereon and a polarizing filter stacked on top of the magnetic film element to polarize light incident upon the magnetic film element. Based on the Kerr effect, light incident upon the magnetic domains will undergo a shift in polarization angle before being reflected back to the polarizing filter. Erasure or alteration of the magnetic domains will modify the polarization shift. A dielectric reflector disposed between the polarizing filter and the magnetic film element will multiply the Kerr effect. A reference image is provided for visual comparison of the light reflected from the magnetic domains.

11 Claims, 3 Drawing Sheets

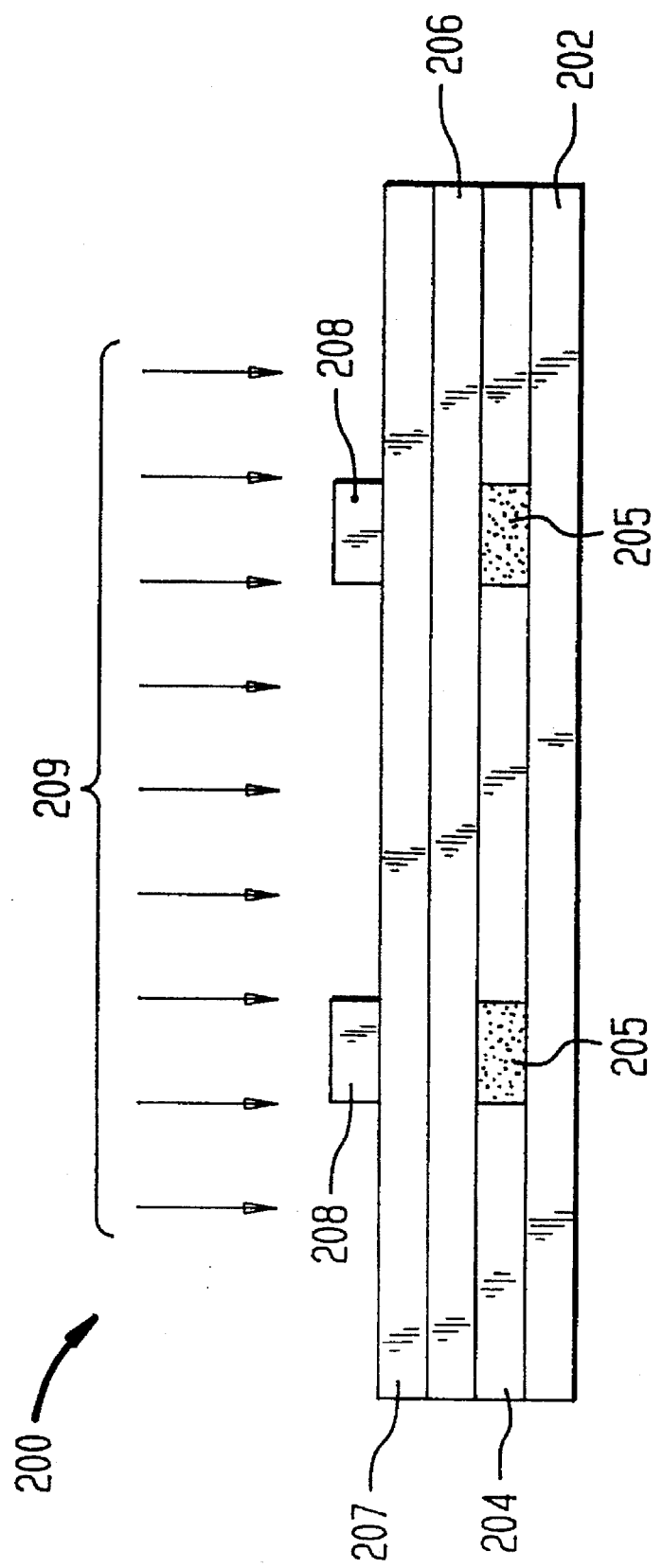

DATA CORRUPTION DETECTOR FOR MAGNETIC MEDIA

BACKGROUND OF THE INVENTION

1. Field of the Invention

The invention relates to the field of magnetic data storage and, more particularly, to an apparatus for confirming the integrity of data stored on tape cartridges or other physical volumes by providing a mechanism for detecting a bulk erasure or other corruption of the magnetic media.

2. Related Art

Magnetic tapes can be used to store a variety of information, such as audio or visual signals and binary data readable by a computer system. The widespread use of magnetic tapes is due, in part, to the ease with which data on tape may be rewritten. Moreover, a magnetic tape can be completely erased and then reused.

Two basic methods have been used to erase magnetic tape. The first method involves placing the tape into a tape drive which will unwind the tape from the supply reel and run it across a degaussing head. This technique takes a considerable length of time and can be especially time consuming with very large reels of tape.

In a second traditional method, the tape is placed into a bulk tape eraser mechanism. The bulk tape eraser mechanism uses a relatively high-intensity magnetic field to degauss the entire reel of tape. This is known as a bulk erasure.

In addition, data stored on a tape may be damaged by intentional or unintentional exposure to a magnetic field of sufficient intensity to alter the state of the data recorded on the magnetic medium. Such a field may be generated by an unshielded permanent magnet or other source of a static or alternating magnetic field.

As the computer and data processing industries store more and more different types of data on magnetic tape cartridges and other magnetic media (e.g., magnetic disks), it is becoming increasingly important to be able to assure or confirm the integrity of the data stored on the media. For example, it may be desirable in certain record archival situation to prevent data on a magnetic tape from being modified. Storage Technology Corporation of Louisville, Colo., has developed a system which allows a magnetic tape recording system to emulate a write-once capability. This system is disclosed in commonly owned U.S. patent application Nos. 07/791,489, filed Nov. 12, 1991, entitled "Method and Apparatus for Administering Data on Magnetic Tape Media," and 07/896,106, filed Jun. 9, 1992, entitled "Method and Apparatus for Managing Data on Rewritable Media to Define Read/Write Operational Status," both of which are incorporated herein by reference.

The system disclosed in these copending patent applications prevents modifications from being made to data stored on a magnetic tape. However, another problem remains in assuring/confirming the integrity of data stored on magnetic tapes. A tape may be bulk erased, and a user may not be able to discern a tape which has been bulk erased from a tape which never had data stored on it. In addition, data stored on the tape may be corrupted by exposure to a magnetic field of insufficient intensity to completely erase the tape. The present invention is directed toward providing a corruption/bulk erasure detector for use with magnetic tapes or other magnetic media volumes.

SUMMARY OF THE INVENTION

The invention is a magnetic field detector for use with a physical volume of magnetic media. The detector is coupled to a housing of the physical volume and indicates whether the housing has been exposed to a magnetic field of sufficient intensity to corrupt or bulk erase the magnetic media.

In a first embodiment, the detector includes a magnetic media element having a predefined pattern of magnetic domains recorded thereon. A read means may be provided to check the magnetic strip for the presence of the prerecorded magnetic domains. If the prerecorded magnetic domains have been altered, then this is an indication that the housing has been exposed to a magnetic field of sufficient magnitude to corrupt or erase the data stored on the magnetic media contained therein.

In a second embodiment, the detector provides a visual indication of whether it has been exposed to a magnetic field of the requisite magnitude. The second embodiment of the detector includes a magnetic film element having a predefined pattern of magnetic domains recorded thereon and a polarizing filter positioned at a first side of the magnetic film element. The filter is configured to polarize light incident upon the magnetic film element. In operation, light incident upon the magnetic domains will undergo a shift in polarization angle (based on the Kerr effect) before being reflected back to the polarizing filter. This shift in polarization angle will result in an attenuation of the light passed through the filter. Exposure to a magnetic field of sufficient magnitude to erase or corrupt the magnetic media will alter the magnetic domains and modify the polarization shift, resulting in a change in attenuation which may be visually or optically perceived.

A dielectric reflector may be disposed between the polarizing filter and the magnetic film element to multiply the Kerr effect. In addition, a reference image may be provided to facilitate visual comparison of the light reflected from the magnetic domains. An adhesive substrate may be attached to a second side of the magnetic film element to allow the detector to be affixed to the housing of the physical volume.

In the preferred implementation of the invention, the physical volume is a tape cartridge, and the magnetic media is a reel of magnetic recording tape.

The foregoing and other objects, features and advantages of the invention will be apparent from the following, more particular description of the preferred embodiments of the invention, as illustrated in the accompanying drawings.

BRIEF DESCRIPTION OF THE FIGURES

FIG. 2 is a cross-sectional view of an embodiment of the detector of the invention.

DETAILED DESCRIPTION OF THE PREFERRED EMBODIMENTS

The preferred embodiments of the invention are discussed in detail below. While specific part numbers and configurations are discussed, it should be understood that this is done for illustration purposes only. A person skilled in the relevant art will recognize that other components and configurations may be used without parting from the spirit and scope of the invention.

The present is described in the environment of a single-reel tape cartridge designed to store digital computer data in a helical format. The helical cartridge, which is substantially similar in dimensions and many other features to an IBM 3480 cartridge (an industry standard), is described in copending and commonly-owned U.S. patent application Ser. No. 07/870,576, filed on Apr. 17, 1992, and titled "Magnetic Tape Cartridge For Helical Scan Transport," which is incorporated herein by reference.

It should be understood, however, that the present invention may be used with any physical volume (e.g., disk packs, tape cartridges, tape cassettes and the like) containing magnetic storage media (e.g., magnetic tape, magnetic disk, ferromagnetic memories, and the like).

The preferred embodiments of the invention are now described with reference to the figures where like reference numbers indicate like elements. Also in the figures, the left most digits of each reference number corresponds to the figure in which the reference number is first used.

Figure 1A:
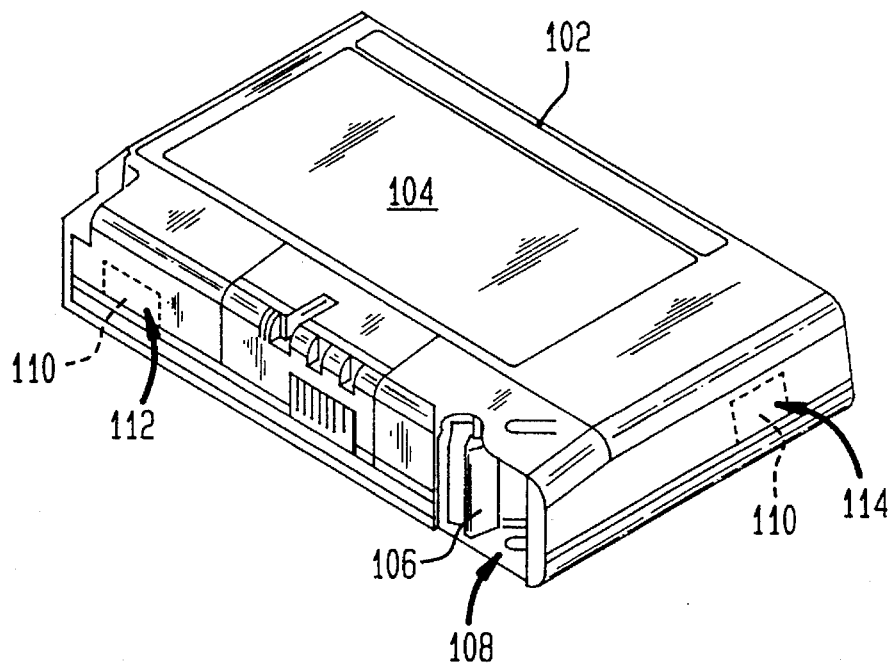
FIGS. 1A and 1B are perspective views of a tape cartridge indicating example locations for implementation of the detector of the invention.

FIG. 1A depicts a tape cartridge 102. Tape cartridge 102 includes a housing 104. A reel of magnetic tape (not shown) is positioned within housing 104. A leader block 106 is used to withdraw the magnetic tape from an opening 108 in housing 104. A magnetic field detector 110 (shown in phantom) is coupled to an inner surface of housing 102 at, for example, a position 112 or a position 114.

Magnetic field detector 110 is configured to detect an externally applied magnetic field of sufficient magnitude to bulk erase or corrupt data recorded on a magnetic medium. As used herein, the term "corrupt" shall include a bulk erasure.

In a first embodiment, magnetic field detector 110 is a magnetic element or strip. Alternatively, a portion of the magnetic tape media (i. e., a small length of magnetic tape) may be used. The magnetic strip has a pattern of magnetic domains recorded thereon. The magnetic domains are stable in normal environmental conditions to which tape cartridge 102 is exposed. However, the magnetic strip is sensitive to influence and disorientation by applied magnetic fields of sufficient magnitude (intensity) to corrupt the magnetic media within cartridge 102.

A read means may be provided to check the magnetic strip for the presence of the prerecorded magnetic domains. If the prerecorded magnetic domains have been altered, then this is an indication that cartridge 102 has been exposed to a magnetic field of sufficient magnitude to corrupt the data stored on the magnetic media within the cartridge.

In the configuration depicted in FIG. 1A, detector 110 is disposed within cartridge housing 104. In order for the read means to access the magnetic strip, housing 104 must be opened. Alternatively, a break-away tab may be provided in housing 104 at, for example, location 112 or location 114 to allow the magnetic strip to be accessed by breaking-away a tab portion of housing 104.

Figure 1B:
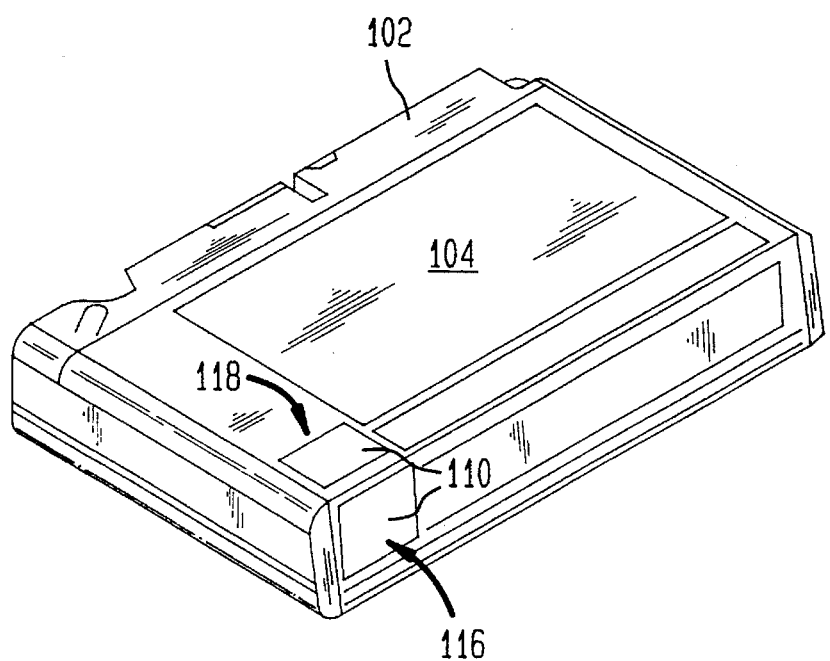

FIG. 1B depicts an alternate view of tape cartridge 102. As illustrated, magnetic field detector 110 may also be positioned on the outer surface of housing 104 at, for example, a position 116 or a position 118. In this configuration, the magnetic strip of magnetic field detector 110 may be accessed by the read means without requiring physical opening or other damage to cartridge housing 104. In fact, means may be provided in a tape drive to automatically query the status of the detector upon insertion of tape cartridge 102 into the tape drive.

While the external positioning of detector 110 allows it to be more conveniently read, detector 110 is more susceptible to tampering in this external configuration.

A second embodiment 200 of magnetic field detector 110 is illustrated in FIG. 2. Detector 200 is configured to provide a visual indication of exposure to a magnetic field of predetermined magnitude. Detector 200 operates on the principle of the Kerr effect. That is, when light is made incident upon a material having magnetic domains, the light reflected from the material will exhibit a change in polarization.

Because detector 200 (i.e., second embodiment of detector 110) provides a visual indication, detector 200 may be attached to the outer surface of housing 104 or, alternatively, may be positioned within housing 104 and a window provided at, for example, position 116 to allow visual or optical inspection of detector 200.

Detector 200 includes an adhesive substrate 202, a magnetic film 204, a dielectric reflector 206, and a polarizing filter 207. Incident light 209 is polarized to a first polarization state (e.g., zero degrees linear) as it passes through filter 207. The polarized light then passes through reflector 206 and is incident upon magnetic film 204. Magnetic film 204 includes prerecorded magnetic domains 205. The light reflected from magnetic domains 205 will have undergone a shift in polarization angle as a result of the Kerr effect. This shift in polarization (e.g., from zero degrees linear) will cause the reflected light to be attenuated upon passing back through filter 207. For example, if the shift in polarization angle is ninety degrees, then filter 207 will prevent the reflected light from passing through it.

Dielectric reflector 206 re-reflects a portion of the light reflected from magnetic film 204 back to film 204. These multiple reflections between reflector 206 and magnetic film 204 will result in a multiplication of the Kerr effect. By multiplying the Kerr effect, the amount of polarization angle change is increased to thereby increase the attenuation of the reflected light by filter 207.

Magnetic film 204 is sensitive to influence and disorientation by applied magnetic fields of sufficient magnitude to corrupt the magnetic media within cartridge 102. Thus, when detector 200 is exposed to a magnetic field having an intensity sufficient to corrupt the magnetic media within cartridge 102, magnetic domains 205 will be disoriented. Thereafter, light reflected from magnetic film 204 will not exhibit the change in polarization angle previously exhibited. This change can be detected as a change in intensity of the light exiting filter 207 in the region where magnetic domains 205 are/had been recorded.

The difference in light intensity may be optically sensed using an optical intensity sensing means. Preferably, however, detector 200 is configured to provide a change in light intensity which can be sensed visually by the human eye.

Figure 3A:
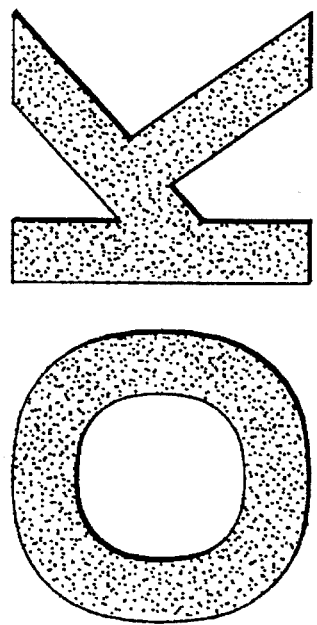
FIGS. 3A and 3B are illustrations of an example reference image according to the invention.
Figure 3B:
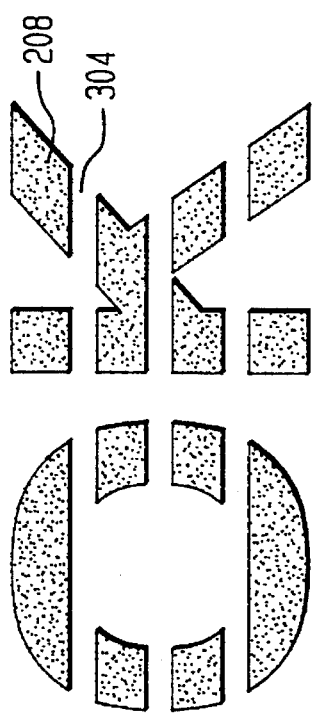

To aid the human eye in perceiving a difference in intensity, a reference image 208 may be imprinted on a surface of detector 200. A sample reference image 208 is shown in FIG. 3A. In this example, image 208 is in the form of the letters "OK". Note however the gaps 304 in the letters. Gaps 304 allow incident light 209 to enter detector 200. When magnetic domains 205 are intact and detector 200 is in its unexposed condition, the light entering gaps 304 will be attenuated by detector 200. This causes the gaps to appear dark to complete reference image 208 into the letters "OK". This is illustrated in FIG. 3B.

Upon exposure of detector 200 to a magnetic field of the requisite intensity, magnetic domains 205 are disoriented. As discussed above, this will result in a change in the intensity of the light reflected through gaps 304. The change in intensity is perceived as a broken "OK" as illustrated in FIG. 3A.

Detector 200 may be implemented in a variety of ways. For example, magnetic film 204 may be deposited on a substrate of mylar, mica or similar mechanically supporting materials. Magnetic film 204 may be any commonly used magnetic material which will allow domains to be recorded in well defined areas, which is stable at the required environmental conditions, and which is sensitive to influence and disorientation by applied magnetic fields of sufficient magnitude to corrupt the magnetic media within cartridge 102. These materials include, but are not limited to, NiFe, NiFeCo, CoNi, FeNiCr, garnet, iron garnet, GdCo, GdFe, MnBi, EuO, and FeEuO.

Dielectric reflector 206 may be deposited as a film on magnetic film 204. Suitable optical materials for enhancing internal reflection of the incident light include, but are not limited to, MgF, ZnS, ZnSe, $ZrO_2$, SiN, SiO, $TiO_2$, $SiO_2$, $Ta_2O_5$, $Al_2O_3$. These materials may also be stacked in mixed combinations to achieve the desired properties.

In yet another embodiment of the invention, the magnetic field detector may be implemented using a ferroelectric LCD (liquid crystal display) with magnetic domains recorded thereon. The ferroelectric LCD will provide a visual indication of exposure to a magnetic field.

While the invention has been particularly shown and described with reference to several preferred embodiments thereof, it will be understood by those skilled in the art that various changes in form and details may be made therein without departing from the spirit and scope of the invention as defined in the appended claims.

What is claimed is:

1. A physical volume for magnetic media, comprising:
   a housing configured to accommodate the magnetic media; and
   detector means coupled to said housing for indicating whether said housing has been exposed to a magnetic field of sufficient intensity to corrupt said magnetic media,
   wherein said detector means comprises:
   a magnetic film element having a predefined pattern of magnetic domains recorded thereon; and
   a polarizing filter positioned at a first side of said magnetic film element and configured to polarize light incident upon said magnetic film element, wherein light incident upon said magnetic domains will undergo a shift in polarization angle before being reflected back to said polarizing filter, and wherein alteration of said magnetic domains will modify said polarization shift.

2. The physical volume of claim 1, wherein said detector means further comprises:
   a dielectric reflector disposed between said polarizing filter and said magnetic film element.

3. The physical volume of claim 2, wherein said detector means further comprises:
   reference image means for providing a visual comparison reference for light reflected back through said polarizing filter.

4. The physical volume of claim 3, wherein said reference image means comprises an image printed on said polarizing filter.

5. The physical volume of claim 4, wherein said detector means further comprises:
   an adhesive substrate attached to a second side of said magnetic film element.

6. The physical volume of claim 5, wherein said physical volume is a tape cartridge and wherein said magnetic media is a reel of magnetic recording tape.

7. A magnetic field detector for a physical volume containing magnetic data storage media, comprising:
   a magnetic film element having a predefined pattern of magnetic domains recorded thereon; and
   a polarizing filter positioned at a first side of said magnetic film element and configured to polarize light incident upon said magnetic film element,
   wherein light incident upon said magnetic domains will undergo a shift in polarization angle before being reflected back to said polarizing filter, and wherein alteration of said magnetic domains will modify said polarization shift.

8. The magnetic field detector of claim 7, further comprising:
   a dielectric reflector disposed between said polarizing filter and said magnetic film element.

9. The magnetic field detector of claim 8, further comprising:
   reference image means for providing a visual comparison reference for light reflected back through said polarizing filter.

10. The magnetic field detector of claim 9, wherein said reference image means comprises an image printed on said polarizing filter.

11. The magnetic field detector of claim 10, further comprising an adhesive substrate attached to a second side of said magnetic film element.

* * * * *